(12) United States Patent
Choi et al.

(10) Patent No.: US 12,021,446 B2
(45) Date of Patent: Jun. 25, 2024

(54) OVERCURRENT PROTECTION DEVICE OF POWER SUPPLY AND OPERATING METHOD THEREOF

(71) Applicant: Samsung Electronics Co., Ltd., Suwon-si (KR)

(72) Inventors: Hangseok Choi, Suwon-si (KR); Sangwoo Kang, Suwon-si (KR); Chuleun Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 17/739,831

(22) Filed: May 9, 2022

(65) Prior Publication Data
US 2022/0345029 A1    Oct. 27, 2022

Related U.S. Application Data

(63) Continuation of application No. PCT/KR2022/005532, filed on Apr. 18, 2022.

(30) Foreign Application Priority Data

Apr. 21, 2021    (KR) .......................... 10-2021-0051782

(51) Int. Cl.
*H02M 1/32* (2007.01)
*G09G 3/3208* (2016.01)
(Continued)

(52) U.S. Cl.
CPC ............ *H02M 1/32* (2013.01); *G09G 3/3208* (2013.01); *H02H 7/1213* (2013.01);
(Continued)

(58) Field of Classification Search
CPC ...... H02M 1/32; H02M 1/0009; H02M 3/158; H02H 7/1213; G09G 2330/04; G09G 3/3208
See application file for complete search history.

(56) References Cited

U.S. PATENT DOCUMENTS 5,821,740 A * 10/1998 Hodgins ................. G05F 1/573
361/57
7,843,178 B1 * 11/2010 Houk ...................... H02M 1/36
323/901
(Continued)

FOREIGN PATENT DOCUMENTS

| JP | 2013-121211 A | 6/2013 |
| JP | 2019-004577 A | 1/2019 |

(Continued)

OTHER PUBLICATIONS

International Search Report dated Jul. 22, 2022, issued in International Patent Application No. PCT/KR2022/005532.

*Primary Examiner* — Rafael O De Leon Domenech
(74) *Attorney, Agent, or Firm* — Jefferson IP Law, LLP

(57) ABSTRACT

An overcurrent protection device of a power supply is provided. The overcurrent protection device includes an inductor, a first switch, a second switch, a feedback controller, a pulse width modulation (PWM) controller, and an overcurrent protection controller. The inductor may be connected to an input terminal of the power supply to which a current is inputted from a power source. The first switch may be connected between an output terminal of the inductor and a ground. The second switch may be connected between the output terminal of the inductor and an output terminal of the power supply. The feedback controller may compare an output voltage of the power supply with an output voltage target value, and generate a control voltage based on a result of comparing the output voltage and the output voltage (Continued)

target value. The PWM controller may control switch-on and switch-off of the first and second switches, and control a peak current of the first switch based on the control voltage. The overcurrent protection controller may include a timing capacitor charged with a current source proportional to the control voltage, and generate an overcurrent control signal for driving the PWM controller based on the control voltage. The overcurrent protection controller may charge the timing capacitor by the current source during a first switching period in which the second switch is turned on. When an output current exceeds a predetermined level regardless of an input voltage from the power source, an operation of the power supply may be stopped based on the overcurrent control signal.

20 Claims, 7 Drawing Sheets

(51) Int. Cl.
*H02H 7/12* (2006.01)
*H02M 1/00* (2006.01)
*H02M 3/158* (2006.01)

(52) U.S. Cl.
CPC ......... *H02M 1/0009* (2021.05); *H02M 3/158* (2013.01); *G09G 2330/04* (2013.01)

(56) References Cited

U.S. PATENT DOCUMENTS

| | | | |
|---|---|---|---|
| 8,320,145 B2 * | 11/2012 | Horii | H02M 3/33507 |
| | | | 323/222 |
| 8,933,922 B2 | 1/2015 | Park | |
| 9,647,445 B2 | 5/2017 | Sanchez Gonzalez et al. | |
| 10,310,589 B2 | 6/2019 | Kwon et al. | |
| 10,361,579 B2 | 7/2019 | Jang et al. | |
| 2006/0132997 A1 * | 6/2006 | Chu | H02M 3/156 |
| | | | 361/79 |
| 2008/0079410 A1 | 4/2008 | Ishii et al. | |
| 2016/0013788 A1 * | 1/2016 | Thalheim | H03K 17/168 |
| | | | 327/109 |
| 2018/0041111 A1 * | 2/2018 | Chan | H02H 3/087 |
| 2018/0309297 A1 | 10/2018 | Rauma et al. | |
| 2018/0367029 A1 | 12/2018 | Maruyama | |
| 2019/0027104 A1 * | 1/2019 | Zhang | G09G 3/20 |

FOREIGN PATENT DOCUMENTS

| | | |
|---|---|---|
| KR | 10-2006-0128194 A | 12/2006 |
| KR | 10-2014-0144360 A | 12/2014 |
| KR | 10-2018-0118044 A | 10/2018 |

\* cited by examiner

OVERCURRENT PROTECTION DEVICE OF POWER SUPPLY AND OPERATING METHOD THEREOF

CROSS-REFERENCE TO RELATED APPLICATION(S)

This application is a continuation application, claiming priority under § 365(c), of an International application No. PCT/KR2022/005532, filed on Apr. 18, 2022, which is based on and claims the benefit of a Korean patent application number 10-2021-0051782, filed on Apr. 21, 2021, in the Korean Intellectual Property Office, the disclosure of which is incorporated by reference herein in its entirety.

TECHNICAL FIELD

The disclosure relates to an overcurrent protection device of a power supply. More particularly, the disclosure relates to an organic light emitting diode (OLED) display, and an operating method thereof.

BACKGROUND ART

An organic light emitting diode (OLED) display is being applied to electronic devices. The OLED is an LED semiconductor device formed of an organic compound layer and does not require a backlight, unlike a liquid crystal display (LCD), because it emits light by itself. In addition, the OLED has a fast response speed, provides clear readability even outdoors, and reduces power consumption when displaying dark images, so it has a better power efficiency in an actual usage environment.

When the OLED display is applied to a mobile electronic device, a power supply including a boost converter is used to supply power higher than a battery voltage. In order to prevent additional losses in a boost power supply circuit and the OLED display when an overcurrent occurs for a certain reason during the operation of the OLED display, an overcurrent protection circuit is applied.

The above information is presented as background information only to assist with an understanding of the disclosure. No determination has been made, and no assertion is made, as to whether any of the above might be applicable as prior art with regard to the disclosure.

DISCLOSURE

Technical Problem

The overcurrent protection circuit of the power supply for the OLED display performs an overcurrent protection (OCP) operation using a peak value of an inductor current. An OCP circuit of the power supply for the OLED display senses the current of an inductor connected to an input terminal, and when the number of times that the current is greater than a reference current is sensed exceeds a predetermined value, stops the operation of the power supply. Although an input current of the power supply may be limited to a certain level or less, there may arise a problem that a power level for operating the OCP circuit varies according to a battery voltage when an input of the power supply is battery power. In addition, there may be a problem that an output voltage changes as the power level for operating the OCP circuit is varied. Various embodiments of the disclosure may provide an overcurrent protection device of a power supply capable of performing the OCP operation at a constant power level regardless of an input power level, and an operating method thereof.

Aspects of the disclosure are to address at least the above-mentioned problems and/or disadvantages and to provide at least the advantages described below. Accordingly, an aspect of the disclosure is to provide an overcurrent protection device of a power supply capable of preventing an overload from being applied to the power supply for the OLED display, and an operating method thereof.

Additional aspects will be set forth in part in the description which follows and, in part, will be apparent from the description, or may be learned by practice of the presented embodiments.

Technical Solution

In accordance with an aspect of the disclosure, an overcurrent protection device of a power supply is provided. The overcurrent protection device includes an inductor, a first switch, a second switch, a feedback controller, a pulse width modulation (PWM) controller, and an overcurrent protection controller. The inductor may be connected to an input terminal of the power supply to which a current is inputted from a power source. The first switch may be connected between an output terminal of the inductor and a ground. The second switch may be connected between the output terminal of the inductor and an output terminal of the power supply. The feedback controller may compare an output voltage of the power supply with an output voltage target value, and generate a control voltage based on a result of comparing the output voltage and the output voltage target value. The PWM controller may control switch-on and switch-off of the first switch and the second switch, and control a peak current of the first switch based on the control voltage. The overcurrent protection controller may include a timing capacitor charged with a current source proportional to the control voltage, and generate an overcurrent control signal for driving the PWM controller based on the control voltage. The overcurrent protection controller may charge the timing capacitor by the current source during a first switching period in which the second switch is turned on. When an output current exceeds a predetermined level regardless of an input voltage from the power source, an operation of the power supply may be stopped based on the overcurrent control signal.

In accordance with another aspect of the disclosure, an operating method of an overcurrent protection device of a power supply is provided. The operating method includes, when a current is inputted from a power source to an inductor connected to an input terminal of the power supply, comparing an output voltage of the power supply with an output voltage target value, and generating a control voltage based on a result of comparing the output voltage and the output voltage target value. The method may include controlling a current peak value of a first switch connected between an output terminal of the inductor and a ground and a current peak value of a second switch connected between the output terminal of the inductor and an output terminal of the power supply to be proportional to the control voltage. The method may include generating an overcurrent control signal for controlling switch-on and switch-off of the first switch and the second switch based on the control voltage. The method may include charging a timing capacitor by a current source during a first switching period in which the second switch is turned on. The method may include stopping an operation of the power supply based on the overcurrent control signal when an output current exceeds a predetermined level regardless of an input voltage from the power source.

Advantageous Effects

The overcurrent protection device of the power supply according to various embodiments of the disclosure may allow an overcurrent protection (OCP) operation to be performed at a constant power level regardless of an input power level.

The overcurrent protection device of the power supply according to various embodiments of the disclosure may prevent an overload from being applied to the power supply for an organic light emitting diode (OLED) display.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
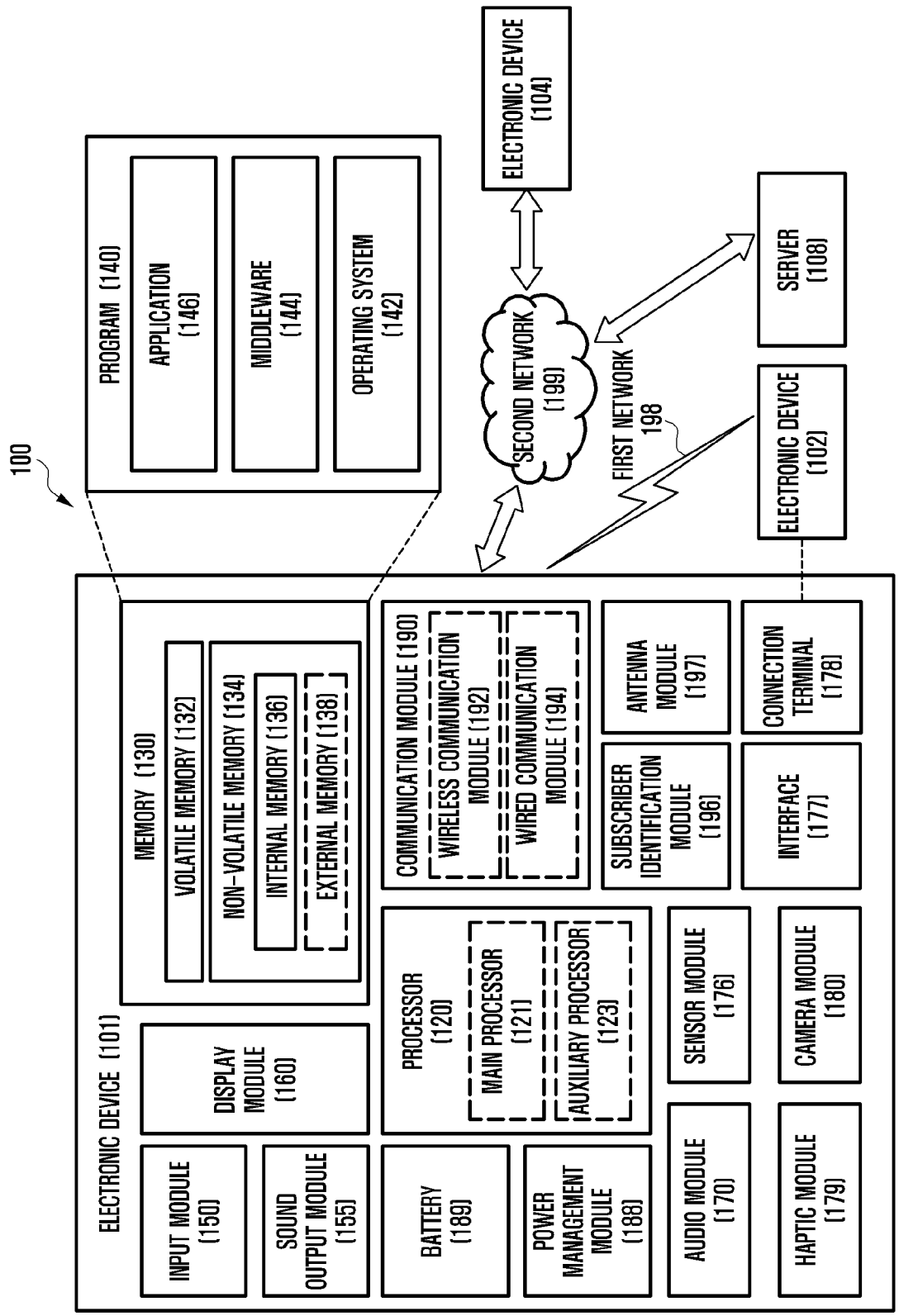
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, the display module 160 shown in FIG. 1 may include a display configured to be folded or unfolded. In a foldable electronic device 101 including the display, a flexible printed circuit board (FPCB) may be folded or unfolded in a folding region where the display is folded.

According to an embodiment, the display module 160 shown in FIG. 1 may include a display that is slidably disposed to provide a screen (e.g., a display screen).

For example, a display area of the electronic device 101 is an area that is visually exposed to output an image, and the electronic device 101 allows the display area to be adjusted in response to the movement of a sliding plate (not shown) or the movement of the display. One example of including the display module 160 is a rollable electronic device 101 in which at least a part (e.g., a housing) of the electronic device 101 is slidably operated at least in part to enable selective expansion of the display area. For example, the display module 160 may be referred to as a slide-out display or an expandable display.

Figure 2:
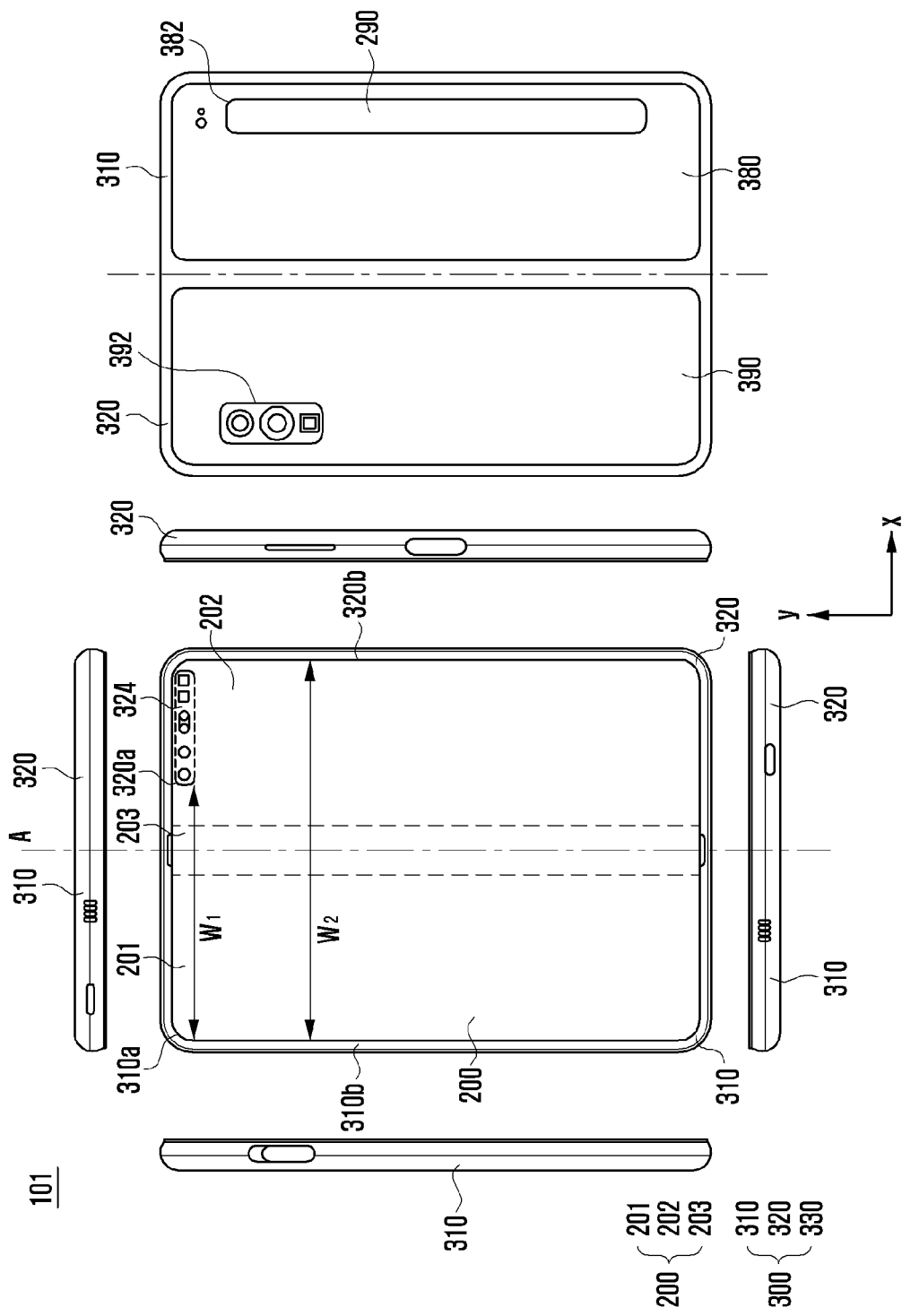
FIG. 2 is a diagram illustrating an unfolded (e.g., opened) state of an electronic device according to an embodiment of the disclosure.

FIG. 2 is a diagram illustrating an unfolded (e.g., opened) state of an electronic device according to an embodiment of the disclosure.

Figure 3:
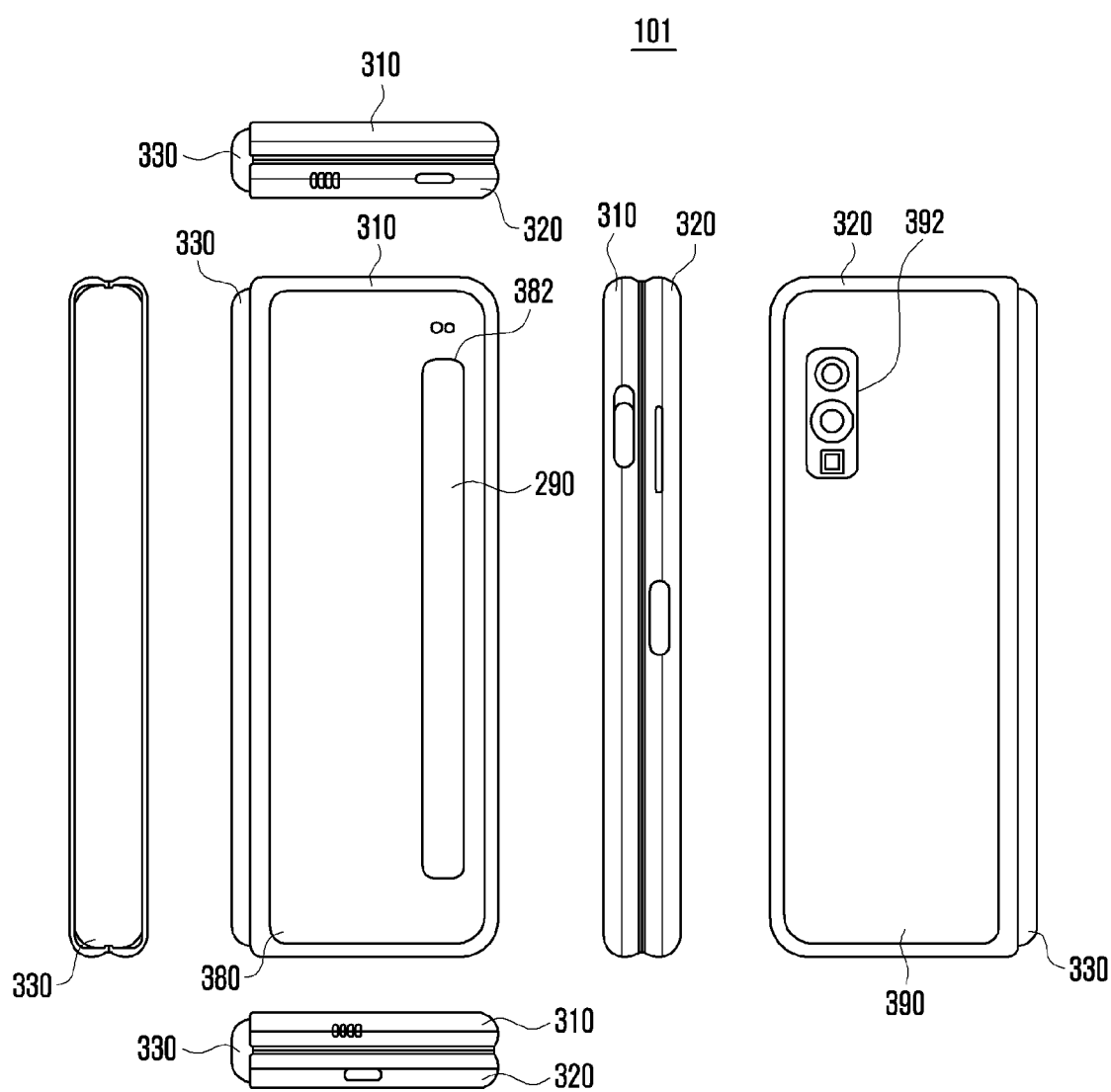
FIG. 3 is a diagram illustrating a folded (e.g., closed) state of an electronic device according to an embodiment of the disclosure.

FIG. 3 is a diagram illustrating a folded (e.g., closed) state of an electronic device according to an embodiment of the disclosure.

Referring to FIGS. 2 and 3, the electronic device 101 may include a housing 300, a hinge cover 330 that covers a foldable portion of the housing 300, and a flexible or foldable display (i.e., a display 200) disposed in a space formed by the housing 300. In the disclosure, the surface on which the display 200 is disposed is defined as a first surface or a front surface of the electronic device 101. In addition, the opposite surface of the front surface is defined as a second surface or a rear surface of the electronic device 101. Also, the surface surrounding a space between the front and rear surfaces is defined as a third surface or a side surface of the electronic device 101. For example, the electronic device 101 may be folded or unfolded in a folding region 203 in the x-axis direction.

In an embodiment, the housing 300 may include a first housing structure 310, a second housing structure 320 having a sensor region 324, and the hinge cover 330. The housing 300 of the electronic device 101 is not limited to the shape and combination shown in FIGS. 2 and 3, and may be implemented in other shape and/or combination of components. For example, in another embodiment, the first housing structure 310 and a first rear cover 380 may be integrally formed, and the second housing structure 320 and a second rear cover 390 may be integrally formed.

In the illustrated embodiment, the first housing structure 310 and the second housing structure 320 may be disposed on both sides about a folding axis A and have an overall symmetrical shape with respect to the folding axis A. As will be described later, an angle or distance between the first housing structure 310 and the second housing structure 320 may be varied depending on whether the state of the electronic device 101 is an unfolded state, a folded state, or an intermediate state. In the illustrated embodiment, the second housing structure 320, unlike the first housing structure 310, has the sensor region 324 in which various sensors are disposed. Except for the sensor region 324, the first and second housing structures may have a symmetrical shape.

In an embodiment, the first housing structure 310 and the second housing structure 320 may form together a recess for accommodating the display 200. In the illustrated embodiment, because of the sensor region 324, the recess may have two or more different widths in a direction perpendicular to the folding axis A.

For example, the recess may have a first width Wi between a first portion 310a of the first housing structure 310 and a first portion 320a of the second housing structure 320 formed at the edge of the sensor region 324. Also, the recess may have a second width $W_2$ between a second portion 310b of the first housing structure 310 that is parallel to the folding axis A and a second portion 320b of the second housing structure 320 that does not correspond to the sensor region 324 and is parallel to the folding axis A. In this case, the second width $W_2$ may be greater than the first width Wi. In other words, the first portion 310a of the first housing structure 310 and the first portion 320a of the second housing structure 320 having an asymmetric shape to each other may form the first width Wi of the recess. Also, the second portion 310b of the first housing structure 310 and the second portion 320b of the second housing structure 320 having a symmetrical shape to each other may form the second width $W_2$ of the recess.

In an embodiment, a first portion 320a and a second portion 320b of the second housing structure 320 may have different distances from the folding axis A. The width of the recess is not limited to the illustrated example. In various embodiments, the recess may have a plurality of widths depending on the shape of the sensor region 324 or a portion having an asymmetric shape between the first and second housing structures 310 and 320.

In an embodiment, at least a portion of the first and second housing structures 310 and 320 may be formed of a metallic or non-metallic material having a selected rigidity to support the display 200.

In an embodiment, the sensor region 324 may be formed to have a certain area adjacent to one corner of the second housing structure 320. However, the arrangement, shape, and size of the sensor region 324 are not limited to the illustrated example. For example, in another embodiment, the sensor region 324 may be provided at another corner of the second housing structure 320 or any position between upper and lower corners. In an embodiment, components for performing various functions of the electronic device 101 may be exposed to the front surface of the electronic device 101 through the sensor region 324 or through one or more openings provided in the sensor region 324. In various embodiments, such components may include various types of sensors. Such sensors may include, for example, at least one of a front camera, a receiver, or a proximity sensor.

The first rear cover 380 is disposed on one side of the folding axis A on the rear surface of the electronic device 101, and may have, for example, a substantially rectangular periphery, which may be surrounded by the first housing structure 310. Similarly, the second rear cover 390 is disposed on the other side of the folding axis A on the rear surface of the electronic device 101, and may have a periphery surrounded by the second housing structure 320.

In the illustrated embodiment, the first rear cover 380 and the second rear cover 390 may have a substantially symmetrical shape with respect to the folding axis A. However, the first and second rear covers 380 and 390 do not necessarily have a symmetrical shape, and in another embodiment, the electronic device 101 may include the first and second rear covers 380 and 390 having various shapes. In still another embodiment, the first rear cover 380 may be integrally formed with the first housing structure 310, and the second rear cover 390 may be integrally formed with the second housing structure 320.

In an embodiment, the first rear cover 380, the second rear cover 390, the first housing structure 310, and the second housing structure 320 may form a space in which various components (e.g., a printed circuit board or a battery) of the electronic device 101 can be disposed. In an embodiment, one or more components may be disposed on or visually exposed to the rear surface of the electronic device 101. For example, at least a portion of a sub-display 290 may be visually exposed through a first rear region 382 of the first rear cover 380. In another embodiment, one or more components or sensors may be visually exposed through a second rear region 392 of the second rear cover 390. In various embodiments, such sensors may include a proximity sensor and/or a rear camera.

The hinge cover 330 may be configured to be disposed between the first housing structure 310 and the second housing structure 320 to obscure an internal component (e.g., a hinge structure). In an embodiment, the hinge cover 330 may be obscured or exposed to the outside by a portion of the first and second housing structures 310 and 320, depending on the state (the unfolded (or flat) state or the folded state) of the electronic device 101.

In an example, when the electronic device 101 is in the unfolded state as shown in FIG. 2, the hinge cover 330 may be obscured and not exposed by the first and second housing structures 310 and 320. In an example, when the electronic device 101 is in the folded state (e.g., a fully folded state) as shown in FIG. 3, the hinge cover 330 may be exposed to the outside between the first and second housing structures 310 and 320. In an example, in case of an intermediate state in which the first and second housing structures 310 and 320 are folded with a certain angle, the hinge cover 330 may be exposed in part to the outside between the first and second housing structures 310 and 320. However, in this case, the exposed area may be less than that in the fully folded state. In an embodiment, the hinge cover 330 may have a curved surface.

The display 200 may be disposed in a space formed by the housing 300. For example, the display 200 may be placed in the recess formed by the housing 300 and form a great part of the front surface of the electronic device 101.

Therefore, the front surface of the electronic device 101 may be composed of the display 200 and a part of the first and second housing structures 310 and 320 adjacent to the display 200. In addition, the rear surface of the electronic device 101 may be composed of the first rear cover 380, a part of the first housing structure 310 adjacent to the first rear cover 380, the second rear cover 390, and a part of the second housing structure 320 adjacent to the second rear cover 390.

The display 200 may refer to a display in which at least a portion can be modified to a flat surface or a curved surface. In an embodiment, the display 200 may have a folding region 203, a first region 201 disposed on one side (e.g., the left side in FIG. 2) of the folding region 203, and a second region 202 disposed on the other side (e.g., the right side in FIG. 2) of the folding region 203. The display 200 may include a polarizing film (or polarizing layer), a window glass (e.g., ultra-thin glass (UTG) or polymer window), and an optical compensation film (OCF).

Dividing the display 200 into regions is exemplary, and the display 200 may be divided into a plurality (e.g., two, four or more) regions based on a structure or function. Although in the embodiment shown in FIG. 2 the display 200 may be divided into regions based on the folding region 203 or the folding axis A extending parallel to the y-axis, in another embodiment the display 200 may also be divided into regions based on another folding region (e.g., a folding region parallel to the x-axis) or another folding axis (e.g. a folding axis parallel to the x-axis).

The first and second regions 201 and 202 may have an overall symmetrical shape with respect to the folding region 203. Unlike the first region 201, the second region 202 may include a notch cut due to the presence of the sensor region 324, but may have a symmetrical shape to the first region 201 in other regions. In other words, the first region 201 and the second region 202 may include a portion having a shape symmetric to each other and a portion having a shape asymmetric to each other.

Hereinafter, the respective regions of the display 200 and the operations of the first and second housing structures 310 and 320 according to the states (e.g., the unfolded (or flat) state and the folded state) of the electronic device 101 will be described.

In an embodiment, when the electronic device 101 is in the unfolded or flat state (e.g., FIG. 2), the first and second housing structures 310 and 320 may be disposed to form an angle of 180 degrees therebetween and face substantially the same direction. The surface of the first region 201 and the surface of the second region 202 of the display 200 may form about 180 degrees with each other and face substantially the same direction (e.g., the front direction of the electronic device 101). The folding region 203 may be substantially coplanar with the first and second regions 201 and 202.

In an embodiment, when the electronic device 101 is in the folded state (e.g., FIG. 3), the first and second housing structures 310 and 320 may be disposed to face each other. The surface of the first region 201 and the surface of the second region 202 of the display 200 may face each other while forming a narrow angle therebetween (e.g., between about 0 degrees and about 10 degrees). The folding region 203 may be formed, at least in part, of a curved surface having a certain curvature.

In an embodiment, when the electronic device 101 is in the intermediate state (or a half folded state), the first and second housing structures 310 and 320 may be disposed with a certain angle therebetween. The surface of the first region 201 and the surface of the second region 202 of the display 200 may form an angle greater than that in the folded state and smaller than that in the unfolded state. The folding region 203 may be formed, at least in part, of a curved surface having a certain curvature, and this curvature may be smaller than that in the folded state.

Figure 4:
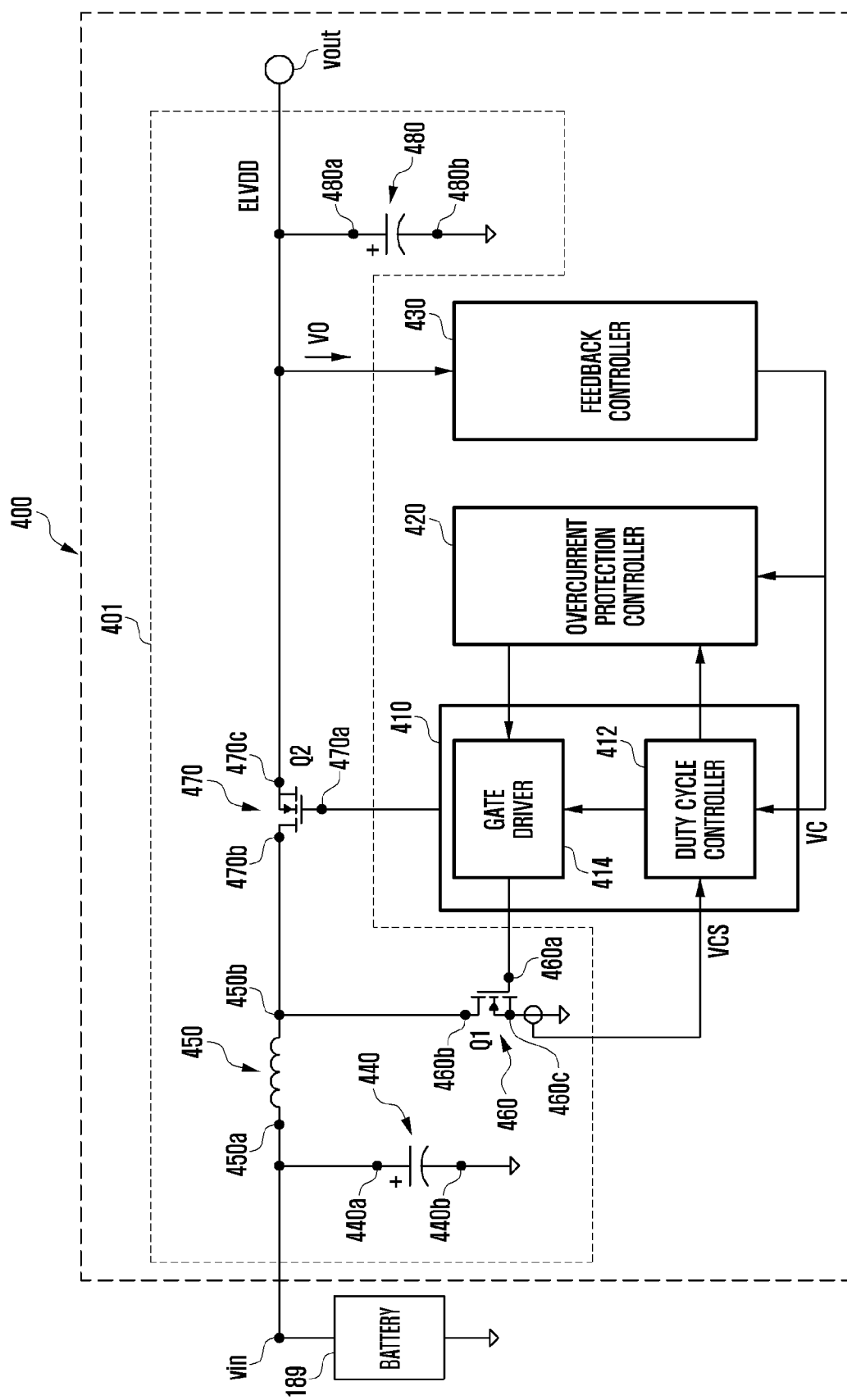
FIG. 4 is a block diagram illustrating an overcurrent protection device of a power supply according to an embodiment of the disclosure.

FIG. 4 is a block diagram illustrating an overcurrent protection device of a power supply according to an embodiment of the disclosure.

Figure 5:
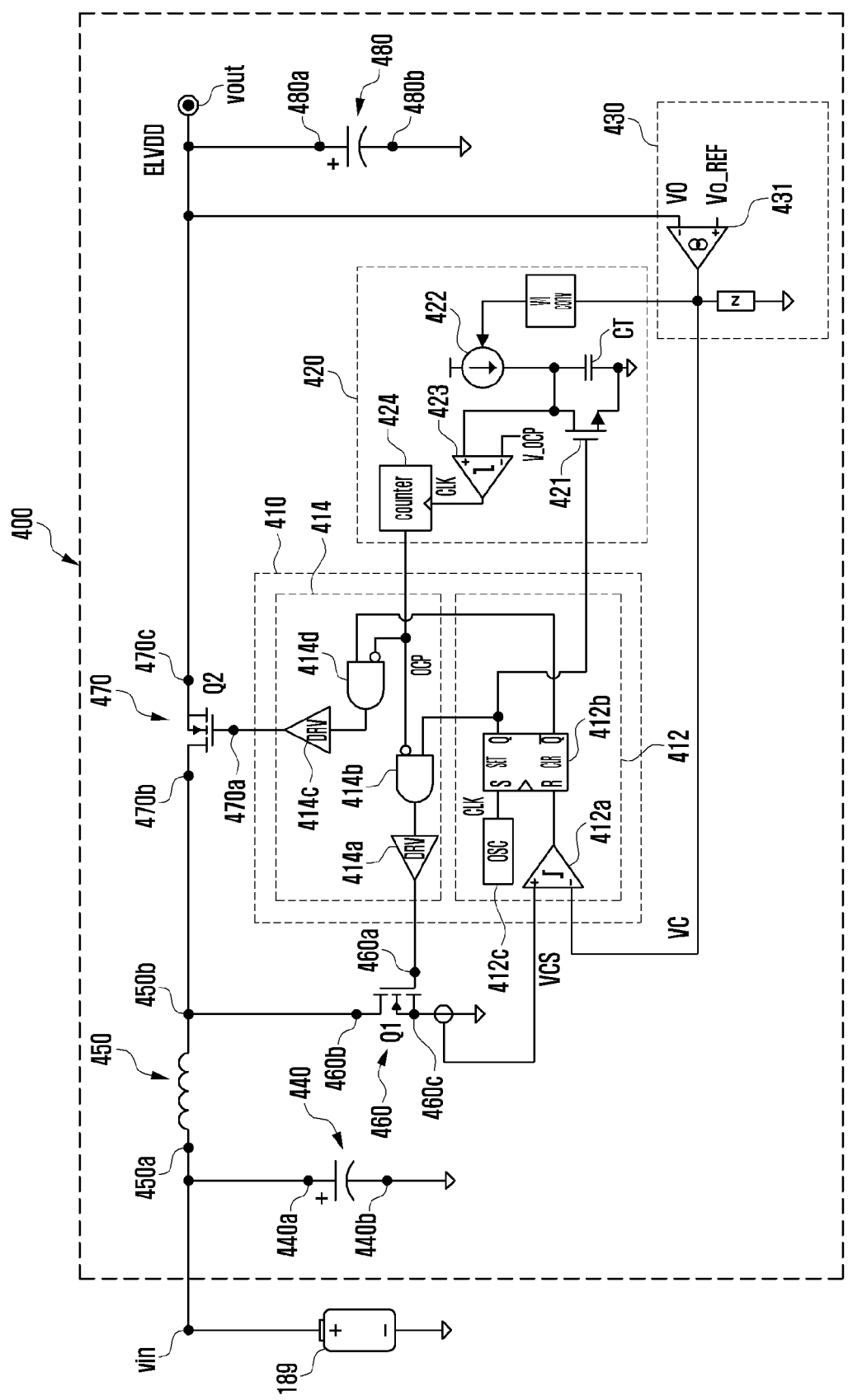
FIG. 5 is a diagram illustrating an overcurrent protection device of a power supply according to an embodiment of the disclosure.

FIG. 5 is a diagram illustrating an overcurrent protection device of a power supply according to an embodiment of the disclosure.

Referring to FIGS. 4 and 5, the overcurrent protection device 400 of the power supply (e.g., a power management module) according to various embodiments of the disclosure is capable of preventing an overload from being applied to a boost converter or a switch mode power supply. In addition, the overcurrent protection device 400 of the power supply may allow an overcurrent protection (OCP) operation to be performed at a constant power level regardless of an input power level.

According to an embodiment, the overcurrent protection device 400 of the power supply may include a pulse width modulation (PWM) controller 410 (e.g., a switch controller), an overcurrent protection controller 420, a feedback controller 430, and a driving circuitry 401. The driving circuitry 401 may include a first capacitor 440 (e.g., a filter capacitor), an inductor 450, a first switch 460 (Q1), a second switch 470 (Q2), and a second capacitor 480 (e.g., an output capacitor).

According to an embodiment, power may be supplied from the battery 189 to an input terminal (vin). A first terminal 440a of the first capacitor 440 (e.g., the filter capacitor) may be electrically connected to the input terminal (yin). A second terminal 440b of the first capacitor 440 (e.g., the filter capacitor) may be electrically connected to the ground. The first capacitor 440 (e.g., the filter capacitor) may be connected in parallel to the battery 189. The input power may be supplied to the inductor 450 through the first capacitor 440 (e.g., the filter capacitor).

A first terminal 450a of the inductor 450 may be electrically connected to the input terminal (vin). A second terminal 450b of the inductor 450 may be electrically connected to the first switch 460 and the second switch 470. A voltage may be induced in proportion to a current inputted to the inductor 450, and a change in current may be sensed based on an output current of the inductor 450.

A first terminal 460a (e.g., a gate terminal) of the first switch 460 (Q1) may be electrically connected to a gate driver 414 of the PWM controller 410. A second terminal 460b of the first switch 460 (Q1) may be electrically connected to the second terminal 450b of the inductor 450, for example, an output terminal of the inductor 450. A third terminal 460c of the first switch 460 (Q1) may be electrically connected to the ground. A first switch driving signal from the gate driver 414 may be inputted to the first terminal 460a of the first switch 460 (Q1). The first switch 460 (Q1) may be turned on/off based on the first switch driving signal inputted from the gate driver 414.

A first terminal 470a (e.g., a gate terminal) of the second switch 470 (Q2) may be electrically connected to the gate driver 414 of the PWM controller 410. A second terminal 470b of the second switch 470 (Q2) may be electrically connected to the second terminal 450b of the inductor 450 and the second terminal 460b of the first switch. A third terminal 470c of the second switch 470 (Q2) may be electrically connected to an output terminal (vout). The third terminal 470c of the second switch 470 (Q2) may be electrically connected to an input terminal of the feedback controller 430 and a first terminal 480a of the second capacitor 480 (e.g., the output capacitor). A second switch driving signal from the gate driver 414 may be inputted to the first terminal 470a of the second switch 470 (Q2). The second switch 470 (Q2) may be turned on/off based on the second switch driving signal inputted from the gate driver 414.

The first terminal 480a of the second capacitor 480 may be electrically connected to the output terminal (vout). A second terminal 480b of the second capacitor 480 may be electrically connected to the ground.

In various embodiments of the disclosure, a period in which the second switch 470 (Q2) is turned on may be referred to as a first switching period, and a period in which the second switch 470 (Q2) is turned off may be referred to as a second switching period. During the first switching period in which the second switch 470 (Q2) is turned on, the output current of the inductor 450 may be outputted to the output terminal (vout), and a current source 422 of the overcurrent protection controller 420 may charge a timing capacitor (CT). The output current may be constantly maintained by a charging voltage of the second capacitor 480 during the second switching period in which the second switch 470 (Q2) is turned off. When the second switch 470 (Q2) is turned off, the second capacitor 480 may be discharged and a voltage may be reset to a ground level.

According to an embodiment, the feedback controller 430 may include a comparator 431. A first terminal of the comparator 431 may be electrically connected to the output terminal (vout). A second terminal of the comparator 431 may be electrically connected to an output terminal of a reference voltage (Vo_REF). The output voltage (VO) may be inputted to the first terminal of the comparator 431, and the reference voltage (Vo_REF) may be inputted to the second terminal of the comparator 431. Using the comparator 431, the feedback controller 430 may compare the output voltage (VO) with the reference voltage (Vo_REF). The feedback controller 430 may generate a control voltage (VC), based on a comparison result between the output voltage and the reference voltage (Vo_REF).

In an embodiment, the feedback controller 430 may compare the output voltage of the power supply with an output voltage target value (e.g., the reference voltage (Vo_REF)) and, based on a comparison result between the output voltage and the output voltage target value (e.g., the reference voltage (Vo_REF)), generate the control voltage (VC). Based on the control voltage (VC), a peak value of a current (e.g., inductor current) outputted from the inductor 450 may be controlled. The control voltage (VC) generated by the feedback controller 430 may be outputted to the PWM controller 410 and the overcurrent protection controller 420.

According to an embodiment, the PWM controller 410 may include a duty cycle controller 412 and the gate driver 414. The PWM controller 410 may control a peak current of the first switch 460 (Q1) and/or a peak current of the second switch 470 (Q2) in proportion to the control voltage (VC).

In an embodiment, the duty cycle controller 412 may include a comparator 412a, a latch unit 412b, and an oscillator 412c (OSC). The gate driver 414 may include a first gate driver 414a, a first logic circuit 414b, a second gate driver 414c, and a second logic circuit 414d. The PWM controller 410 may compare the control voltage (VC) and a first current (VCS) of the first switch 460 (Q1) (e.g., the output current of the first switch 460). Then, based on a comparison result between the control voltage (VC) and the first current (VCS) of the first switch 460 (Q1) (e.g., the output current of the first switch 460), the PWM controller 410 may generate the first switch driving signal for controlling the first switch 460 (Q1) and the second switch driving signal for controlling the second switch 470 (Q2).

In an embodiment, the duty cycle controller 412 of the PWM controller 410 may receive the control voltage (VC) from the feedback controller 430 and the first current (VCS) of the first switch 460 (Q1) (e.g., the output current of the first switch 460 (Q1)). The comparator 412a of the duty cycle controller 412 may compare the control voltage (VC) and the first current (VCS) of the first switch 460 (Q1). A comparison value between the control voltage (VC) and the first current (VCS) of the first switch 460 (Q1) may be inputted to the latch unit 412b. A pulse signal from the oscillator 412c as well as the comparison value between the control voltage (VC) and the first current (VCS) may be inputted to the latch unit 412b. Upon receiving the pulse signal from the oscillator 412c and the comparison value between the control voltage (VC) and the first current (VCS), the latch unit 412b may generate an output signal (e.g., a PWM signal). The output signal of the latch unit 412b may be inputted to the gate driver 414.

In an embodiment, a first output signal of the latch unit 412b may be inputted to the first logic circuit 414b of the gate driver 414. A second output signal of the latch unit 412b may be inputted to the second logic circuit 414d of the gate driver 414. The first and second output signals of the latch unit 412b may be signals inverted to each other. Together with the first output signal of the latch unit 412b, the overcurrent control signal of the overcurrent protection controller 420 may be inputted to the first logic circuit 414b of the gate driver 414. Together with the second output signal of the latch unit 412b, the overcurrent control signal of the overcurrent protection controller 420 may be inputted to the second logic circuit 414d of the gate driver 414.

In an embodiment, upon receiving the first output signal of the latch unit 412b and the overcurrent control signal of the overcurrent protection controller 420, the first logic circuit 414b of the gate driver 414 may output a first driving signal for driving the first gate driver 414a. Upon receiving the second output signal of the latch unit 412b and the overcurrent control signal of the overcurrent protection controller 420, the second logic circuit 414d of the gate driver 414 may output a second driving signal for driving the second gate driver 414c.

In an embodiment, the first gate driver 414a of the gate driver 414 may generate the first switch driving signal, based on the inputted first driving signal. The first switch driving signal generated by the first gate driver 414a may be inputted to the first terminal 460a (e.g., the gate terminal) of the first switch 460 (Q1). The first switch 460 (Q1) may be turned on/off, based on the first switch driving signal inputted from the gate driver 414. For example, the first switch driving signal may be inputted to the first terminal 460a (e.g., the gate terminal) of the first switch 460 (Q1) to control the first switch 460 (Q1) to be turned on/off.

In an embodiment, the second gate driver 414c of the gate driver 414 may generate the second switch driving signal, based on the inputted second driving signal. The second switch driving signal generated by the second gate driver 414c may be inputted to the first terminal 470a (e.g., the gate terminal) of the second switch 470 (Q2). The second switch 470 (Q2) may be turned on/off, based on the second switch driving signal inputted from the gate driver 414. For example, the second switch driving signal may be inputted to the first terminal 470a (e.g., the gate terminal) of the second switch 470 (Q2) to control the second switch 470 (Q2) to be turned on/off.

In the above description with reference to FIG. 5, it has been described that the duty cycle controller 412 of the PWM controller 410 includes the comparator 412a, the latch unit 412b, and the oscillator 412c, and the gate driver 414 includes the first gate driver 414a, the first logic circuit 414b, the second gate driver 414c, and the second logic circuit 414d. However, this is not construed as a limitation, and the PWM controller 410 may be configured to include other electronic elements and logic circuits as well as the electronic elements and logic circuits illustrated in FIG. 5.

According to an embodiment, the overcurrent protection controller 420 may receive the control voltage (VC) from the feedback controller 430. The overcurrent protection controller 420 may calculate an output current, based on the control voltage (VC) and a switch-on time of the second switch 470 (Q2). The overcurrent protection controller 420 may generate the overcurrent control signal for performing the overcurrent protection (OCP) operation, based on the calculated output current.

According to an embodiment, the overcurrent protection controller 420 may include a switch 421, a timing capacitor (CT), a current source 422, a comparator 423, and a counter 424.

The switch 421 may be turned on/off by the first output signal of the latch unit 412b of the duty cycle controller 412. The current source 422 may output a current proportional to the control voltage (VC) to the timing capacitor (CT) so as to charge the timing capacitor (CT). During the first switching period in which the second switch 470 is turned on (e.g., during a period in which the switch 421 is turned off), the current source 422 may charge the timing capacitor (CT). During the second switching period in which the second switch is turned off (e.g., during a period in which the switch 421 is turned on), the timing capacitor (CT) may be discharged.

In an embodiment, the timing capacitor (CT) may be charged by the current source 422 proportional to the peak current (e.g., the control voltage (VC)) of the second switch 470 (Q2).

In an embodiment, an over current protection (OCP) reference voltage (V_OCP) and a charging voltage (VCT) of the timing capacitor (CT) may be inputted to the comparator 423. The comparator 423 may output a comparison value between the OCP reference voltage (V_OCP) and the charging voltage (VCT) of the timing capacitor (CT) to the counter 424.

In an embodiment, the counter 424 may generate a count signal according to the comparison value between the OCP reference voltage (V_OCP) and the charging voltage (VCT) of the timing capacitor (CT). The counter 424 may output the generated count signal to the PWM controller 410. In an embodiment, the counter 424 may generate a count signal for the number of times that the charging voltage (VCT) of the timing capacitor (CT) exceeds the OCP reference voltage (V_OCP), and output it to the PWM controller 410. For example, the counter 424 may generate a count signal for a time when the charging voltage (VCT) of the timing capacitor (CT) exceeds the OCP reference voltage (V_OCP), and output it to the PWM controller 410. For example, the counter 424 may count the number of times that the charging voltage (VCT) of the timing capacitor (CT) exceeds the OCP reference voltage (V_OCP). The counter 424 may determine whether a specified condition (e.g., a duration or a reference number of times) is satisfied, and transmit a count signal to the PWM controller 410.

In the above description with reference to FIG. 5, it has been described that the overcurrent protection controller 420 includes the switch 421, the timing capacitor (CT), the current source 422, the comparator 423, and the counter 424. However, this is not construed as a limitation, and the overcurrent protection controller 420 may be configured to include other electronic elements and logic circuits as well as the electronic elements and logic circuits illustrated in FIG. 5.

In an embodiment, when the count signal is continuously generated for a predetermined time, the OCP operation may be performed such that the PWM controller 410 turns off the first switch 460 (Q1) and the second switch 470 (Q2) to shut down the operation of the power supply (e.g., output power).

In an embodiment, when the count signal exceeds the reference number of times for a predetermined time, the OCP operation may be performed such that the PWM controller 410 turns off the first switch 460 (Q1) and the second switch 470 (Q2) to shut down the operation of the power supply (e.g., output power).

The overcurrent protection device 400 of the disclosure is capable of stopping the operation of the power supply, based on the overcurrent control signal, when the output current exceeds a certain level, regardless of the input voltage from a power source (e.g., the battery 189). Through this, it is possible to operate the OCP level of the boost converter used for the display at a constant output current regardless of the input voltage and thereby precisely implement the overcurrent protection function of the power supply.

Figure 6:
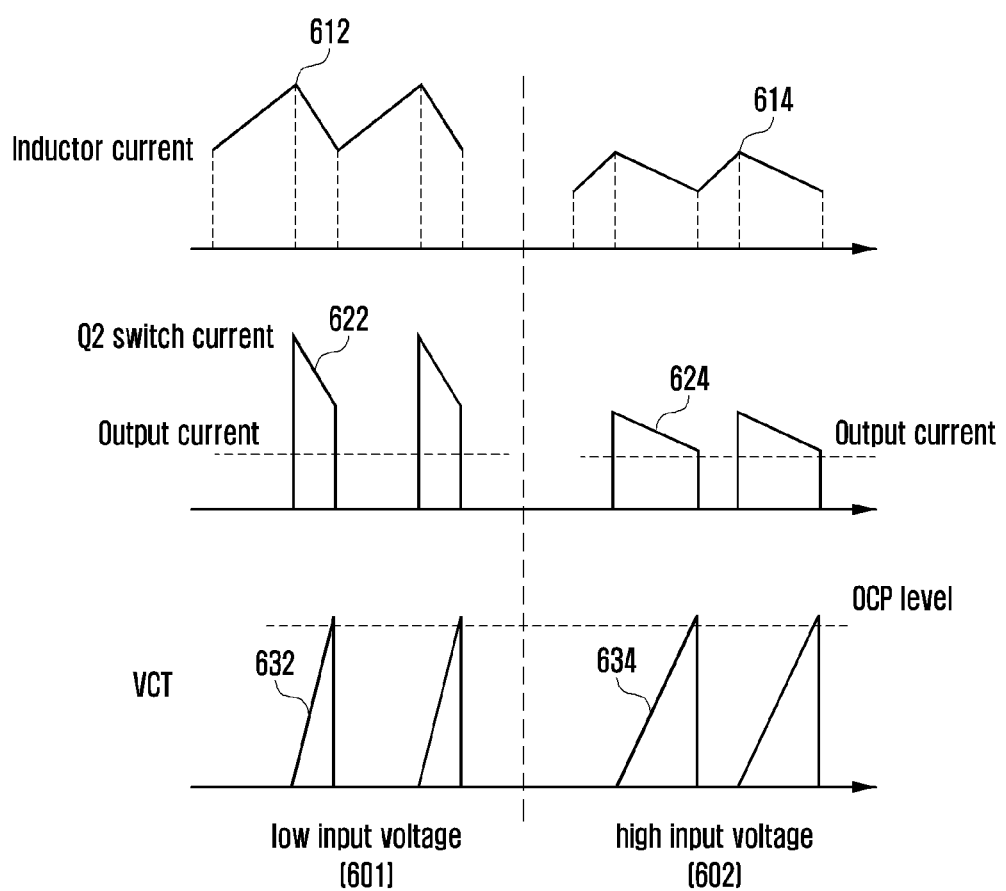
FIG. 6 is a waveform diagram illustrating signals of an overcurrent protection device of a power supply according to an embodiment of the disclosure.

FIG. 6 is a waveform diagram illustrating signals of an overcurrent protection device (e.g., the overcurrent protection device 400 in FIGS. 4 and 5) of a power supply according to an embodiment of the disclosure.

With reference to FIGS. 4 to 6, based on the control voltage (VC) generated by the feedback controller 430 of the overcurrent protection device 400, a current flowing through the inductor 450 (e.g., an inductor current 612 or 614) can be controlled. For example, it is possible to determine the peak value of the first inductor current 612 when the voltage level of the battery 189 of the electronic device 101 is a low voltage 601 and the peak value of the second inductor current 614 when the voltage level is a high voltage 602.

In an embodiment, the peak values of switch-on currents 622 and 624 of the second switch 470 (Q2) may be different when the low voltage 601 is inputted from the battery 189 and when the high voltage 602 is inputted. When the low voltage 601 is inputted from the battery 189, the peak value of the switch-on current 622 of the second switch 470 (Q2) is high, but the switch-on time of the second switch 470 (Q2) may be formed short. When the high voltage 602 is inputted from the battery 189, the peak value of the switch-on current 624 of the second switch 470 (Q2) is relatively lower than when the low voltage 601 is inputted, but the switch-on time of the second switch 470 (Q2) may be formed to be relatively longer than when the low voltage 601 is inputted. Accordingly, first accumulated values of the switch-on current 622 of the second switch 470 (Q2) for a predetermined time when the low voltage 601 is inputted from the battery 189 may be equal to second accumulated values of the switch-on current 624 of the second switch 470 (Q2) for the predetermined time when the high voltage 602 is inputted. Thus, it is possible to maintain, at the same level, the OCP level of a charging voltage (VCT) 632 of the timing capacitor (CT) when the low voltage 601 is inputted from the battery 189 and the OCP level of a charging voltage (VCT) 634 of the timing capacitor (CT) when the high voltage 602 is inputted.

During the period in which the second switch 470 (Q2) is turned off (e.g., during the first switching period), the current source 422 may charge the timing capacitor (CT) in proportion to the control voltage (VC) generated by the overcurrent protection controller 420. As such, when the timing capacitor (CT) is charged, the peak values of the charging voltages (VCTs) 632 and 634 of the timing capacitor (CT) are proportional to the average value of current flowing through the second switch 470 (Q2) in case that a switching cycle is constant. Accordingly, regardless of the input voltage (vin) (e.g., the output voltage of the battery 189), the output current can be accurately exhibited.

Figure 7:
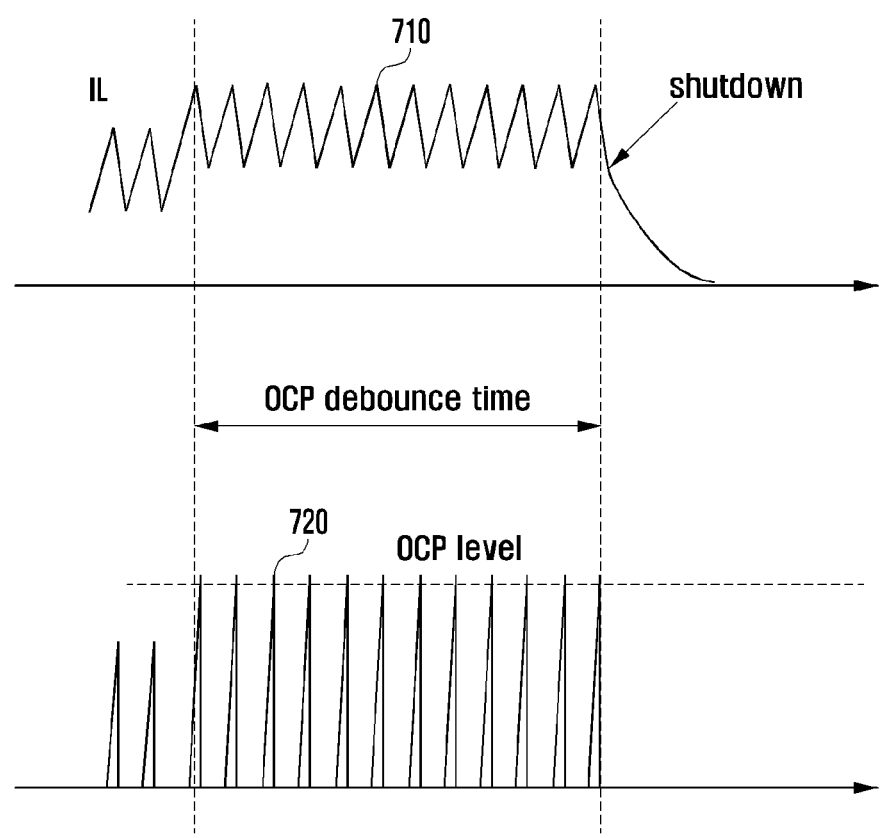
FIG. 7 is a diagram illustrating stopping the operation of a power supply when switching that exceeds a reference current continues for more than a predetermined time according to an embodiment of the disclosure.

FIG. 7 is a diagram illustrating stopping the operation of a power supply when switching that exceeds a reference current continues for more than a predetermined time according to an embodiment of the disclosure.

With reference to FIGS. 4, 5 and 7, when an overcurrent occurs (e.g., when the output current exceeds a certain level), the operation of the power supply may be stopped (e.g., the first switch 460 (Q1) and the second switch 470 (Q2) may be turned off) based on the overcurrent control signal to prevent burnout of the display (e.g., OLED) connected to the output terminal (vout).

In an embodiment, the number of times that the charging voltage 720 (VCT) of the timing capacitor (CT) exceeds the OCP reference voltage (V_OCP) may be counted for a predetermined time. The number of times that the charging voltage 720 (VCT) of the timing capacitor (CT) exceeds the OCP reference voltage (V_OCP) may be compared with a predetermined reference number of times. When switching in which the charging voltage 720 (VCT) of the timing capacitor (CT) exceeds the OCP reference voltage (V_OCP) continuously exceeds the reference number of times, the OCP operation may be performed.

In an embodiment, a time for which the charging voltage 720 (VCT) of the timing capacitor (CT) exceeds the OCP reference voltage (V_OCP) may be counted. The time for which the charging voltage 720 (VCT) of the timing capacitor (CT) exceeds the OCP reference voltage (V_OCP) may be compared with a predetermined reference time. When the time for which the charging voltage 720 (VCT) of the timing capacitor (CT) exceeds the OCP reference voltage (V_OCP) is greater than the predetermined reference time, the OCP operation may be performed.

In an embodiment, the PWM controller 410 may turn off the first switch 460 (Q1) and the second switch 470 (Q2) through the OCP operation and thereby stop the operation of the power supply (e.g., cut off the output power). For example, the output 710 of the power supply may be cut off (e.g., shut down).

The overcurrent protection device 400 of the power supply according to various embodiments of the disclosure may prevent an overload from being applied to a boost converter or a switch mode power supply.

The overcurrent protection device 400 of the power supply according to various embodiments of the disclosure may allow the OCP operation to be performed at a constant power level regardless of an input power level.

The overcurrent protection device 400 of the power supply according to various embodiments of the disclosure may prevent an overload from being applied to the power supply for the display (e.g., the OLED display).

According to various embodiments of the disclosure, an overcurrent protection device (e.g., the overcurrent protection device 400 in FIG. 4 or FIG. 5) of a power supply may include an inductor (e.g., the inductor 450 in FIGS. 4 and 5), a first switch (e.g., the first switch 460 in FIGS. 4 and 5), a second switch (e.g., the second switch 470 in FIGS. 4 and 5), a feedback controller (e.g., the feedback controller 430 in FIGS. 4 and 5), a pulse width modulation (PWM) controller (e.g., the PWM controller 410 in FIGS. 4 and 5), and an overcurrent protection controller (e.g., the overcurrent protection controller 420 in FIGS. 4 and 5). The inductor 450 may be connected to an input terminal of the power supply to which a current is inputted from a power source. The first switch 460 may be connected between an output terminal of the inductor 450 and a ground. The second switch 470 may be connected between the output terminal of the inductor 450 and an output terminal of the power supply. The feedback controller 430 may compare an output voltage (vout) of the power supply with an output voltage target value, and generate a control voltage (VC) based on a result of comparing the output voltage (vout) and the output voltage target value. The PWM controller 410 may control switch-on and switch-off of the first and second switches 460 and 470, and control a peak current of the first switch 460 based on the control voltage (VC). The overcurrent protection controller 420 may include a timing capacitor (TC) charged with a current source (e.g., the current source 422 in FIG. 5) proportional to the control voltage (VC), and generate an overcurrent control signal for driving the PWM controller based on the control voltage (VC). The overcurrent protection controller 420 may charge the timing capacitor (TC) by the current source 422 during a first switching period in which the second switch 470 is turned on. When an output current exceeds a predetermined level regardless of an input voltage (vin) from the power source, an operation of the power supply may be stopped based on the overcurrent control signal.

According to an embodiment, the operation of the power supply may be stopped by turning off the first switch and the second switch 460 and 470.

According to an embodiment, the timing capacitor (TC) may be discharged during a second switching period in which the second switch is turned off.

According to an embodiment, the overcurrent protection controller 420 may determine whether a charging voltage of the timing capacitor (TC) exceeds a predetermined overcurrent protection (OCP) reference voltage.

According to an embodiment, a number of times that the charging voltage of the timing capacitor (TC) exceeds the OCP reference voltage may be counted. The PWM controller may turn off the first switch 460 and the second switch 470 when the number of times that the charging voltage of the timing capacitor (TC) exceeds the OCP reference voltage is greater than a reference number of times for a predetermined time.

According to an embodiment, a time that the charging voltage of the timing capacitor (TC) exceeds the OCP reference voltage may be counted. The PWM controller may turn off the first switch 460 and the second switch 470 when the charging voltage of the timing capacitor (TC) continuously exceeds the OCP reference voltage for a predetermined time.

According to an embodiment, the PWM controller may include a first gate driver (e.g., the first gate driver 414a in FIG. 5) for controlling the switch-on and switch-off of the first switch 460 and a second gate driver (e.g., the second gate driver 414c in FIG. 5) for controlling the switch-on and switch-off of the second switch 470.

According to an embodiment, the PWM controller may drive the first gate driver 414a and the second gate driver 414c, based on the control voltage (VC) from the feedback controller 430 and an output current of the first switch 460.

According to an embodiment, the first switch 460 may be turned on or off based on an output signal of the first gate driver 414*a*. The second switch 470 may be turned on or off based on an output signal of the second gate driver 414*c*.

According to an embodiment, a first terminal of the timing capacitor (TC) may be connected to the current source 422, and a second terminal of the timing capacitor may be connected to the ground.

According to various embodiments of the disclosure, an operating method of an overcurrent protection device (e.g., the overcurrent protection device 400 in FIGS. 4 and 5) of a power supply may include, when a current is inputted from a power source to an inductor (e.g., the inductor 450 in FIG. 4 or 5) connected to an input terminal of the power supply, comparing an output voltage (vout) of the power supply with an output voltage target value, and generating a control voltage (VC) based on a result of comparing the output voltage (vout) and the output voltage target value. The method may include controlling a current peak value of a first switch (e.g., the first switch 460 in FIGS. 4 and 5) connected between an output terminal of the inductor 450 and a ground and a current peak value of a second switch (e.g., the second switch 470 in FIGS. 4 and 5) connected between the output terminal of the inductor 450 and an output terminal of the power supply to be proportional to the control voltage. The method may include generating an overcurrent control signal for controlling switch-on and switch-off of the first and second switches 460 and 470 based on the control voltage (VC). The method may include charging a timing capacitor (e.g., the timing capacitor (TC) in FIG. 5) by a current source (e.g., the current source 422 in FIG. 5) during a first switching period in which the second switch 470 is turned on. The method may include stopping an operation of the power supply based on the overcurrent control signal when an output current exceeds a predetermined level regardless of an input voltage (yin) from the power source.

According to an embodiment, a first gate driver (e.g., the first gate driver 414*a* in FIG. 5) for controlling the switch-on and switch-off of the first switch 460 may be driven, based on the control voltage (VC) and an output current of the first switch 460. A second gate driver (e.g., the second gate driver 414*c* in FIG. 5) for controlling the switch-on and switch-off of the second switch 470 may be driven, based on the control voltage (VC) and an output current of the first switch 460.

According to an embodiment, the first switch 460 may be turned on or off based on an output signal of the first gate driver 414*a*. The second switch 470 may be turned on or off based on an output signal of the second gate driver 414*c*.

According to an embodiment, the operation of the power supply may be stopped by turning off the first switch 460 and the second switch 470.

According to an embodiment, the timing capacitor (TC) may be discharged during a second switching period in which the second switch 470 is turned off.

According to an embodiment, it may be determined whether a charging voltage of the timing capacitor (TC) exceeds a predetermined overcurrent protection (OCP) reference voltage.

According to an embodiment, a number of times and/or a time that the charging voltage of the timing capacitor (TC) exceeds the OCP reference voltage may be counted.

According to an embodiment, the first switch 460 and the second switch 470 may be turned off when the number of times that the charging voltage of the timing capacitor (TC) exceeds the OCP reference voltage is greater than a reference number of times for a predetermined time.

According to an embodiment, the first switch 460 and the second switch 470 may be turned off when the charging voltage of the timing capacitor (TC) continuously exceeds the OCP reference voltage for a predetermined time.

According to an embodiment, the switch-on and switch-off of the first and second switches 460 and 470 may be controlled such that the current peak value of the first switch 460 and the current peak value of the second switch 470 are equal to the overcurrent control signal.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An overcurrent protection device of a power supply, comprising:
   an inductor connected to an input terminal of the power supply to which a current is inputted from a power source;
   a first switch connected between an output terminal of the inductor and a ground;
   a second switch connected between the output terminal of the inductor and an output terminal of the power supply;
   a feedback controller configured to:
      compare an output voltage of the power supply with an output voltage target value, and
      generate a control voltage based on a result of comparing the output voltage and the output voltage target value;
   a pulse width modulation (PWM) controller configured to:
      control switch-on and switch-off of the first switch and the second switch, and
      control a peak current of the first switch based on the control voltage; and
   an overcurrent protection controller comprising a timing capacitor charged with a current source proportional to the control voltage, and the overcurrent protection controller is configured to:
      generate an overcurrent control signal for driving the PWM controller based on the control voltage, and
      charge the timing capacitor by the current source during a first switching period in which the second switch is turned on,
   wherein, when an output current exceeds a predetermined level regardless of an input voltage from the power source, an operation of the power supply is stopped based on the overcurrent control signal.

2. The overcurrent protection device of claim 1, wherein the PWM controller is further configured to stop the operation of the power supply by turning off the first switch and the second switch.

3. The overcurrent protection device of claim 1, wherein the timing capacitor is discharged during a second switching period in which the second switch is turned off.

4. The overcurrent protection device of claim 3, wherein the overcurrent protection controller is further configured to determine whether a charging voltage of the timing capacitor exceeds a predetermined overcurrent protection (OCP) reference voltage.

5. The overcurrent protection device of claim 4,
   wherein the overcurrent protection controller is further configured to count a number of times that the charging voltage of the timing capacitor exceeds the OCP reference voltage, and wherein the PWM controller is further configured to turn off the first switch and the second switch when the number of times that the charging voltage of the timing capacitor exceeds the OCP reference voltage is greater than a reference number of times for a predetermined time.

6. The overcurrent protection device of claim 4,
wherein the overcurrent protection controller is further configured to count a time that the charging voltage of the timing capacitor exceeds the OCP reference voltage, and
wherein the PWM controller is further configured to turn off the first switch and the second switch when the charging voltage of the timing capacitor continuously exceeds the OCP reference voltage for a predetermined time.

7. The overcurrent protection device of claim 1, wherein the PWM controller comprises a first gate driver for controlling the switch-on and switch-off of the first switch and a second gate driver for controlling the switch-on and switch-off of the second switch.

8. The overcurrent protection device of claim 7, wherein the PWM controller is further configured to drive the first gate driver and the second gate driver, based on the control voltage from the feedback controller and an output current of the first switch.

9. The overcurrent protection device of claim 8,
wherein the first switch is turned on or off based on an output signal of the first gate driver, and
wherein the second switch is turned on or off based on an output signal of the second gate driver.

10. The overcurrent protection device of claim 1, wherein the timing capacitor comprises:
a first terminal connected to the current source, and
a second terminal connected to the ground.

11. An operating method of an overcurrent protection device of a power supply, comprising:
when a current is inputted from a power source to an inductor connected to an input terminal of the power supply,
comparing an output voltage of the power supply with an output voltage target value, and generating a control voltage based on a result of comparing the output voltage and the output voltage target value;
controlling a current peak value of a first switch connected between an output terminal of the inductor and a ground and a current peak value of a second switch connected between the output terminal of the inductor and an output terminal of the power supply to be proportional to the control voltage;
generating an overcurrent control signal for controlling switch-on and switch-off of the first switch and the second switch based on the control voltage;
charging a timing capacitor by a current source during a first switching period in which the second switch is turned on; and
stopping an operation of the power supply based on the overcurrent control signal when an output current exceeds a predetermined level regardless of an input voltage from the power source.

12. The method of claim 11, further comprising:
driving a first gate driver for controlling the switch-on and switch-off of the first switch, based on the control voltage and an output current of the first switch; and
driving a second gate driver for controlling the switch-on and switch-off of the second switch, based on the control voltage and an output current of the first switch.

13. The method of claim 12,
wherein the first switch is turned on or off based on an output signal of the first gate driver, and
wherein the second switch is turned on or off based on an output signal of the second gate driver.

14. The method of claim 13, wherein the stopping of the operation of the power supply comprises turning off the first switch and the second switch.

15. The method of claim 13, wherein the timing capacitor is discharged during a second switching period in which the second switch is turned off.

16. The method of claim 15, further comprising:
determining whether a charging voltage of the timing capacitor exceeds a predetermined overcurrent protection (OCP) reference voltage.

17. The method of claim 16, further comprising:
counting at least one of a number of times or a time that the charging voltage of the timing capacitor exceeds the OCP reference voltage.

18. The method of claim 17, wherein the first switch and the second switch are turned off when the number of times that the charging voltage of the timing capacitor exceeds the OCP reference voltage is greater than a reference number of times for a predetermined time.

19. The method of claim 17, wherein the first switch and the second switch are turned off when the charging voltage of the timing capacitor continuously exceeds the OCP reference voltage for a predetermined time.

20. The method of claim 13, wherein the switch-on and switch-off of the first switch and the second switch are controlled such that the current peak value of the first switch and the current peak value of the second switch are equal to the overcurrent control signal.

* * * * *